United States Patent [19]

Samoto

[11] Patent Number: 5,583,063
[45] Date of Patent: Dec. 10, 1996

[54] METHOD OF FORMING T-SHAPED, CROSS-SECTIONAL PATTERN USING TWO LAYERED MASKS

[75] Inventor: Norihiko Samoto, Tokyo, Japan

[73] Assignee: NEC Corporation, Tokyo, Japan

[21] Appl. No.: 346,401

[22] Filed: Nov. 29, 1994

[30] Foreign Application Priority Data

Nov. 30, 1993 [JP] Japan .................................. 5-300253

[51] Int. Cl.⁶ .............................................. H01L 21/265
[52] U.S. Cl. .................................. 437/40; 437/39; 437/41; 437/187; 437/203; 437/228; 437/229; 437/912; 437/944; 148/DIG. 100; 430/296; 430/312; 430/407
[58] Field of Search ................................. 437/912, 229, 437/203, 944, 228, 228 M, 228 ES, 228 LD, 228 O, 228 JR, 40 GS, 40 RG, 41 GS, 41 RG, 41 SH, 187, 39; 148/DIG. 100; 430/296, 312, 394, 407

[56] References Cited

U.S. PATENT DOCUMENTS

| | | | |
|---|---|---|---|
| 4,959,326 | 9/1990 | Roman et al. | 437/229 |
| 4,985,374 | 1/1991 | Tsuji et al. | 437/229 |
| 5,116,772 | 5/1992 | Park et al. | 437/41 |
| 5,122,387 | 6/1992 | Takenaka et al. | 430/296 |
| 5,139,968 | 8/1992 | Hayase et al. | 437/175 |
| 5,288,654 | 2/1994 | Kasai et al. | 437/912 |
| 5,288,660 | 2/1994 | Hua et al. | 437/187 |
| 5,304,511 | 4/1994 | Sakai | 437/944 |
| 5,445,979 | 8/1995 | Hirano | 437/912 |

FOREIGN PATENT DOCUMENTS

| | | | |
|---|---|---|---|
| 0370428 | 5/1990 | European Pat. Off. | 437/912 |
| 0410385 | 1/1991 | European Pat. Off. | 437/912 |
| 0592064 | 4/1994 | European Pat. Off. | 437/912 |
| 7183037 | 11/1982 | Japan | 437/944 |
| 0081441 | 3/1990 | Japan | 437/944 |
| 0142143 | 5/1990 | Japan | 437/944 |
| 0285645 | 11/1990 | Japan | 437/912 |
| 3030337 | 2/1991 | Japan | 437/912 |
| 4-368135 | 12/1992 | Japan . | |
| 5-166717 | 7/1993 | Japan . | |
| 5299440 | 11/1993 | Japan | 437/944 |
| 405335339 | 12/1993 | Japan | 430/312 |
| 406005631 | 1/1994 | Japan | 430/312 |

Primary Examiner—George Fourson
Assistant Examiner—Long Pham
Attorney, Agent, or Firm—Laff, Whitesel, Conte & Saret, Ltd.

[57] ABSTRACT

A method of forming a T-shaped, cross-sectional pattern that enables upper and lower parts of the T-shaped patten using in first and second resist films layers independent of an existence of a mixing layer. A first resist film that is not sensitive to UV light is formed on or over a substrate and a first window is formed on or over a substrate and a first window is formed in the first resist film. The first window corresponds to the lower part of the T-shaped pattern. Next, a second resist film is formed on the first resist film to cover the first window. The second resist film is exposed to UV light to form a given image in the second resist film and is developed to form a second window in the second resist film. The second window corresponds to the upper part of the pattern.

14 Claims, 5 Drawing Sheets

METHOD OF FORMING T-SHAPED, CROSS-SECTIONAL PATTERN USING TWO LAYERED MASKS

BACKGROUND OF THE INVENTION

1. Field of the Invention

The present invention relates to a method of forming a T-shaped pattern and more particularly, to a method of forming a T-shaped, cross-sectional pattern using two layered masks, which is applicable for producing a gate electrode of a field-effect transistor that has a T-shaped, cross-section using the lift-off technique.

2. Description of the Prior Art

A conventional method of forming a T-shaped, cross-sectional pattern using upper and lower layered masks is shown in FIGS. 1A to 1G, which is disclosed in the Japanese Patent Publication No. 4-368135 (December, 1992). In the method, a positive photoresist film is used as an upper one of the layered mask and a positive electron resist film is used as a lower one thereof.

First, as shown in FIG. 1A, an electron resist film 22 as the lower mask is formed on a semiconductor substrate 21 and then, a photoresist film 23 as the upper mask is formed on the electron resist film 22 to cover the film 22.

Next, as shown FIG. 1B, the photoresist film 23 is selectively exposed to ultraviolet (UV) light 24 to transfer a given pattern to the film 23.

Using a known image-reversal technique, the exposed portion 23b of the photoresist film 23 is changed to be less soluble and the unexposed portion 23a thereof is changed to more soluble in the developer solution.

Subsequently, the photoresist film 23 thus image-reversed is developed, so that the unexposed part 23a of the film 23 is selectively removed to produce a window 28 with a tapered profile therein, as shown in FIG. 1C. In the tapered window 28, the top end of the film 23 overhangs the bottom end thereof; in other words, the film 23 is undercut. The electron resist film 22 is not covered with the photoresist film 23 in the window 28.

Then, as shown in FIG. 1D, an electron beam (EB) 25 is selectively irradiated to the electron resist film 22 through the window 28. The irradiated part 22a of the film 22 becomes more soluble in a developer solution for the film 22 due to interaction of electrons and the film material.

The part 22a of the electron resist film 22 is selectively removed through a development process to produce a window 29 in the film 22, as shown in FIG. 1E. Thus, a pattern with a T-shaped, cross section is formed by the windows 28 and 29 on the substrate 21.

Subsequently, the substrate 21 is selectively etched through the windows 28 and 29 to form a recess 26 with a given depth therein. Then, to form a gate electrode of a field-effect transistor using the T-shaped pattern, a metal film 27 is formed by evaporation on the photoresist film 23, so that the metal film 27 is deposited also on the electron resist film 22 through the window 28 and on the substrate 21 through the windows 28 and 29, as shown in FIG. 1F.

Finally, both of the photoresist film 23 and electron resist film 22 are removed by the lift-off technique. As a result, only a part of the metal film 27 within the windows 28 and 28 is left, providing a gate electrode with a T-shaped cross section as shown in FIG. 1G.

As another conventional method, a method of forming a fine pattern applicable for semiconductor device fabrication is disclosed in the Japanese Patent Publication No. 5-166717 (July, 1993).

In this conventional method, a first resist film is formed on a semiconductor substrate and is patterned to produce a window therein. Then, a second resist film capable of producing a mixing layer is formed on the first resist film with the window.

The first and second resist films are baked to produce a mixing layer at the interface of the both films and thereafter, the second resist film is removed except for the mixing layer that is not yet subjected to the mixing phenomenon.

Thus, a window smaller than the initial window of the first resist film by twice the thickness of the mixing layer can be obtained.

With the conventional method shown in FIGS. 1A to 1G, the window 28 is formed in the photoresist film 23 as the upper mask, and then the window 29 is formed in the electron film 22 as the lower mask. As a result, there is a disadvantage that the window 29 is impossible to be formed in the electron resist film 22 by using the developer solution for the film 22 if the mixing layer is produced at the interface of the films 22 and 23.

Also, since the minimum size or limit of the window 29 is determined by the performance of an electron beam lithography system used for the irradiation process of FIG. 1D, there arises another disadvantage that the windows 29 cannot be made less than the limit.

There is a further disadvantage that the electron resist film 22 as the lower mask cannot be developed by using any developer solution that dissolves the photoresist film 23 because the electron resist film 22 is electron-irradiated and developed after forming the window 28 in the photoresist film 23.

SUMMARY OF THE INVENTION

Accordingly, an object of the present invention is to provide a method of forming a T-shaped pattern that can form a T-shaped, cross-sectional pattern independent of existence of a mixing layer.

Another object of the present invention is to provide a method of forming a T-shaped pattern in which a first resist film can be developed by using any developer solution that dissolves the first resist film independent of a second resist film.

Still another object of the present invention is to provide a method of forming a T-shaped pattern in which a T-shaped pattern can be formed at a smaller size than that of the performance limit of an electron beam lithography system.

A method of forming a T-shaped, cross-sectional pattern according to the present invention contains the following steps: The T-shaped pattern has a first cross-sectional part and a second cross-sectional part larger than the first part.

A first resist film is formed on or over a substrate and then, a first window is produced in the first resist film through exposure and development processes. The first window corresponds to the first part of the pattern.

Next, a second resist film is formed on the first resist film to cover the first window. The second resist film is sensitive to UV light.

The second resist film is exposed to the UV light to create an image in the second resist film, and is developed to produce a second window according to the image in the second resist film. The second window corresponds to the second part of the pattern.

With the method of the invention, after the first window is produced in the first resist film formed on or over the substrate, the second window is produced in the second resist film. Therefore, the first window can be produced in the first resist film using a developer solution for the first resist film even if a mixing layer is present at an interface of the first and second resist films. In other words, the first window can be produced independent of existence of the mixing layer.

Also, because the second window is produced in the second resist film after forming the first window in the first resist film, the first resist film can be developed by an developer solution that dissolves the first resist film during the development process independent of the second resist film.

Further, since a mixing layer may be produced at an interface of the first and second resist films, a T-shaped pattern can be formed at a smaller size than that of the performance limit of an electron beam lithography system.

Preferably, the second resist film is subjected to image-reversal process at a temperature from 20° to 110° C. for 60 minutes or less to create a mixing layer at an interface of the first and second resist films. Due to the above temperature restriction, the profile or pattern of the first window is ensured not to be changed or deviated through the image-reversal process.

Also, preferably, the first resist film is not sensitive to the UN light for the second resist film. In this case, there is an additional advantage that unwanted exposure of the first resist film does not occur during an exposure process of the second resist film, preventing the first window from expanding.

DETAILED DESCRIPTION OF THE PREFERRED EMBODIMENTS

Figure 1A:
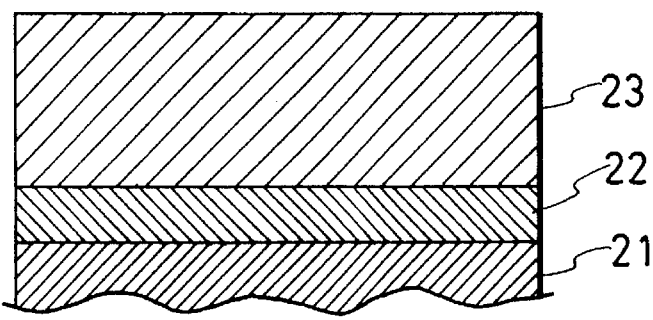
FIGS. 1A to 1G are partially cross-sectional views showing a process sequence of a conventional method of forming a T-shaped pattern, respectively.
Figure 1B:
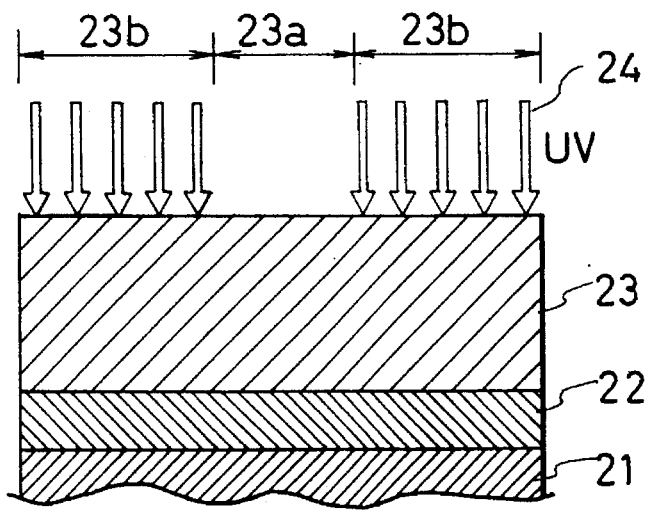
Figure 1C:
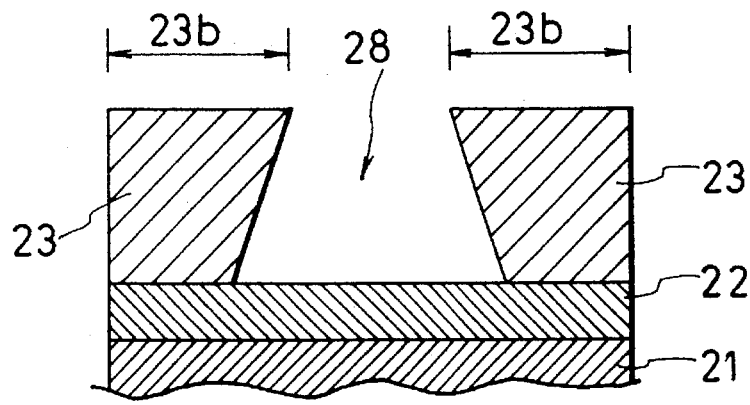
Figure 1D:
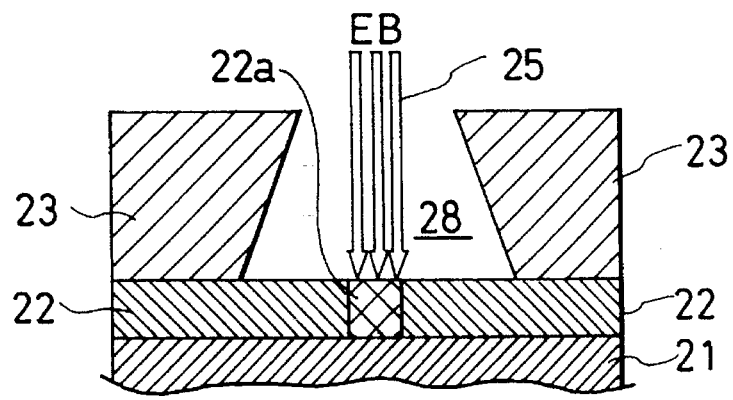
Figure 1E:
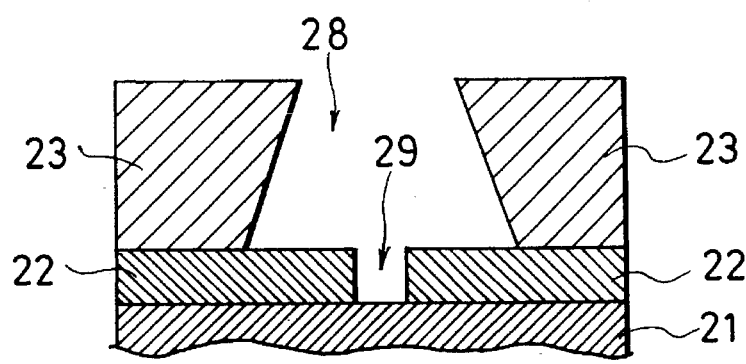
Figure 1F:
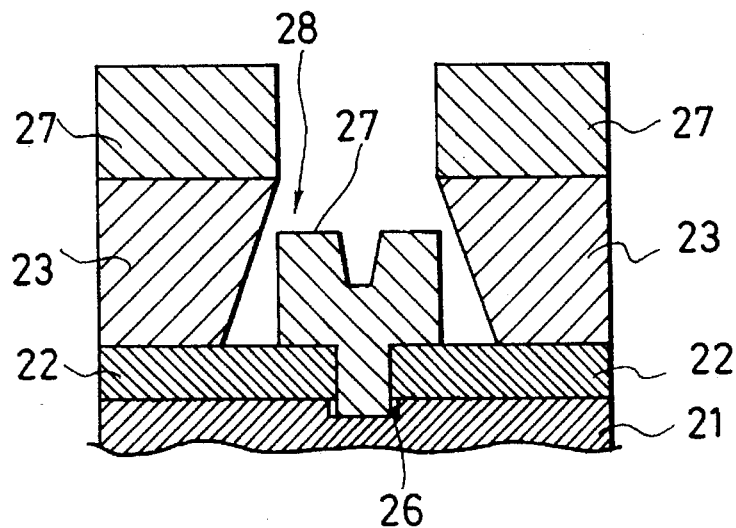
Figure 1G:
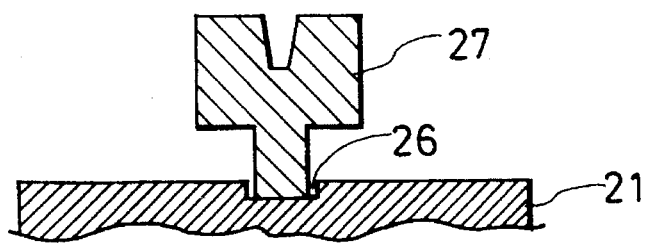

A preferred embodiment of the present invention will be described below referring to the drawings attached.

A method of forming a T-shaped, cross-sectional pattern according to an embodiment of the invention is shown in FIGS. 2A to 2H, which is applied for making a T-shaped gate electrode of a field-effect transistor formed on semiconductor integrated circuits, Such gate electrode has an advantage of reduced electric resistance.

Figure 2A:
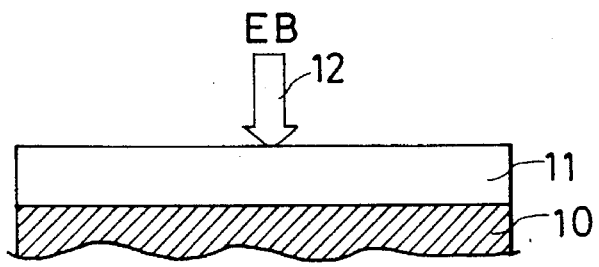
FIGS. 2A to 2H are partially cross-sectional views showing a process sequence of a method of forming a T-shaped pattern according to an embodiment of the present invention, respectively.

In the method, first, as shown in FIG. 2A, a positive electron resist film 11 of an acrylic system having a thickness of 0.16 μm is formed by coating on a semiconductor substrate 10 as a lower mask. Preferably, a polymethylmethacrylate (PMMA) or polymethylacrylic acid (PMAA) film may be used as the electron resist film 11, and a gallium arsenide (GaAs) substrate may be used as the substrate 10.

Figure 2B:
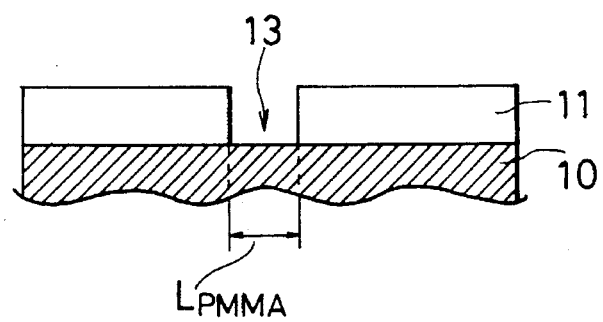

Then, an electron beam (EB) is selectively irradiated to a given part of the electron resist film 11. The irradiated part of the film 11 becomes more soluble in a developer solution for the film 11 due to an interaction of electrons and the film material. The film 11 is then developed to produce a first penetrating window 13 of a rectangular plan shape therein, as shown in FIG. 2B. The window 13 has an initial length of $L_{PMMA}$ and an initial, specified width.

Figure 2C:
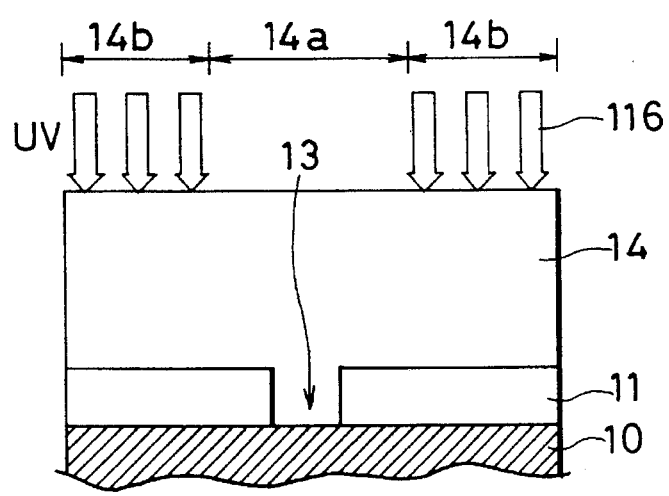

Next, as shown in FIG. 2C, a positive photoresist film 14 with a thickness of 1.0 μm is formed by coating on the electron resist film 11 to cover the first window 13 thereof as an upper mask. Preferably, PFI-15A produced by the SUMITOMO CHEMICAL INCORPORATED or THRM-iP3300 produced by TOKYO OHKA KOGYO CO., LTD. is used as the photoresist film 14.

The photoresist film 14 is selectively exposed to UV light 116 such as the i-line with a wavelength of 365 nm to transfer a given pattern to the film 14. The exposed portion 14b of the photoresist film 14 is changed to be more soluble in an organic alkaline developer solution used for the film 14. The solubility of the unexposed portion 14a thereof in this solution is not changed.

The photoresist film 14 thus exposed is then subjected to the following process of reversing an image of the pattern transferred i.e., of realizing the image-reversal of the pattern. Through this image-reversal process, the exposed portion 14b of the film 14 is changed to less soluble in the above organic alkaline developer solution and the unexposed portion 14a thereof is changed to more soluble therein.

During the image-reversal process, the photoresist film 14, electron resist film 11 and the substrate 10 are kept in an ammonia ($NH_3$) gas at a temperature range from 20° to 110° C. for 60 minutes or less.

Figure 2D:
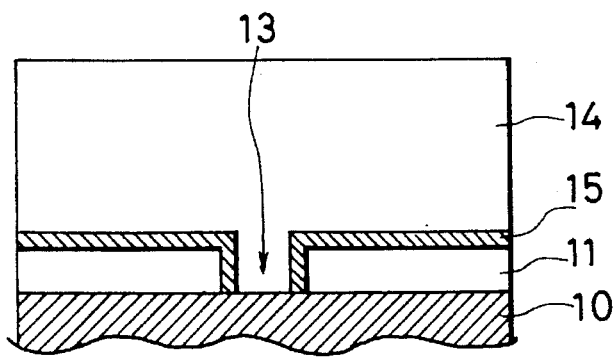

Also, during this process, a mixing layer 15 is produced at an interface or contact area of the photoresist film 14 and the electron resist film 11, as shown in FIG. 2D. The mixing layer 15 thus produced has a thickness of 15 to 25 nm and is present not only at the top face of the film 11 but also at the wall of the first window 13.

The temperature and the period of time for the image-reversal process may be determined so that the mixing layer 15 has a desired thickness.

The production mechanism of the mixing layer 15 has not been made clear; however, the inventor supposed the mechanism as follows:

The molecules of the electron resist and photoresist films 11 and 14 diffuse mutually at the interface thereof during the image-reversal process; thus, the mixing layer 15 is produced at the interface. Also, the molecules of the electron resist film 11 and those of the photoresist film 14 are coupled together, or they are decomposed respectively during this process, and as a result, they are changed in structure to different molecules. Due to this structural change of the molecules, the electron resist film 11 cannot be removed by any developer solution for the film 11.

Figure 2E:
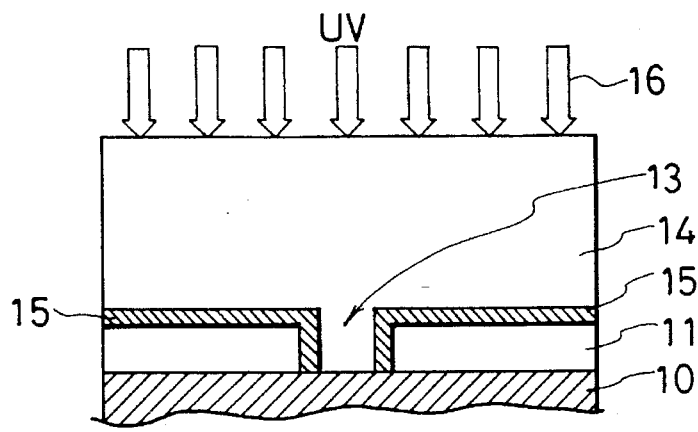

Subsequently, as shown in FIG. 2E, the photoresist film 14 thus image-reversed is entirely exposed to UV light 16 again to make the unexposed part 14a of the film 14 corresponding to a second window 17 soluble in the developer solution therefor.

Figure 2F:
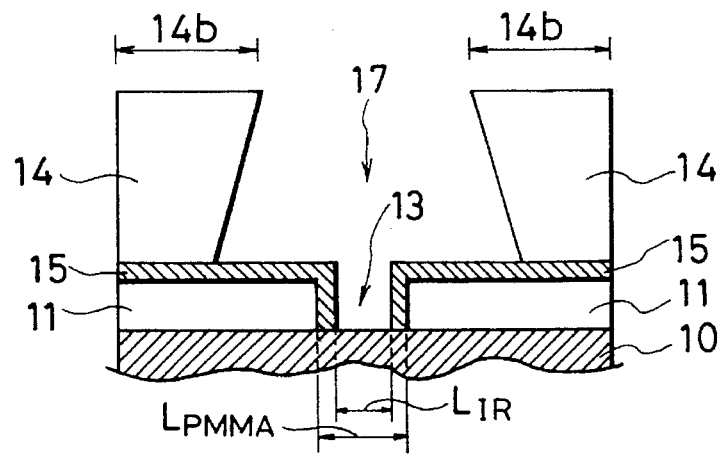

Then, the photoresist film 14 is developed using the above organic alkaline developer solution. Thus, the unexposed part 14a of the film 14 at the first exposure step in FIG. 2C is selectively removed to produce the second window 17 with a tapered, cross-sectional profile therein, as shown in FIG. 2F. The mixing layer 15 remains at the interface of the resist films 11 and 14 after this development process.

In the taped second window 17, the top end of the film 14 overhangs the bottom end thereof, in other words, the film 14 is undercut. The electron resist film 11 is not covered with the photoresist film 14 in the second window 28.

The second window 17 has a rectangular plan shape and is placed right above the first window 13. The window 17 communicates vertically with the window 13, so that a T-shaped, cross-sectional pattern is obtained, as shown in FIG. 2F.

The first window 13 is narrowed by the mixing layer 15 formed on the walls of the window 13, so that it has a length of $L_{IR}$ narrower than the initial length $L_{PMMA}$. Here, the thickness of the mixing layer 15 is defined as $T_M$, the following equation is established as $$L_{IR} = L_{PMMA} - 2T_M$$

Similarly, the width of the first window 13 is shortened by $2T_M$ due to the mixing layer 15.

Subsequently, the substrate 10 is selectively etched through the first and second windows 13 and 17 to form a recess 9 with a given depth therein. The length of the recess 9 is substantially equal to $L_{IR}$.

Figure 2G:
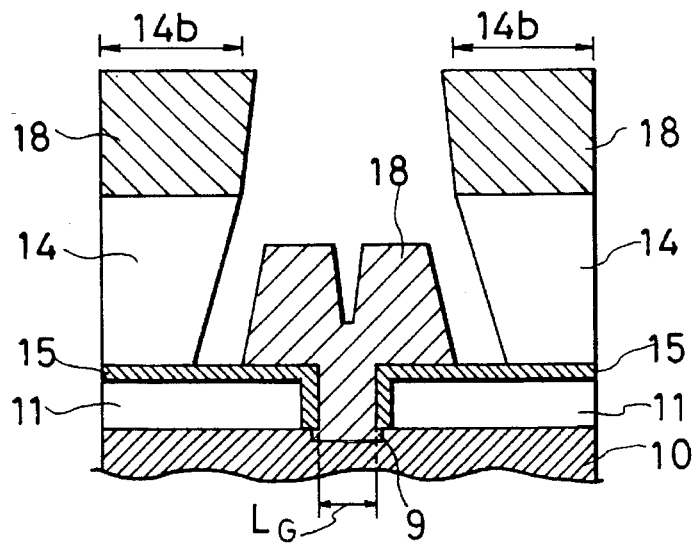

Then, to form the T-shaped gate electrode of the transistor using the T-shaped, cross-sectional pattern, a metal film 18 is formed by evaporation on the photoresist film 14. During this metallization process, the metal film 18 is deposited also on the mixing layer 15 through the second window 28 and on the bottom of the recess 9 of the substrate 10 through the both windows 28 and 29, as shown in FIG. 2G.

The metal film 18 may be formed by a single metal layer or a plurality of metal layers. In the latter case, a three-layer structure made of titanium (Ti), platinum (Pt) and gold (Au) layers are preferably used.

Since the recess 9 is not always necessary for the embodiment, the metal film 18 may be directly on the surface of the substrate 10.

Finally, the substrate 10 with the resist films 11 and 14 and the mixing layer 15 is dipped into a specified organic solvent and then, both of the resist films 11 and 14 are lifted off or removed entirely. Through this lift-off process, the metal film 18 formed on the photoresist film 14 is removed together with the film 14 and the mixing layer 15 is removed together with the film 11.

Figure 2H:
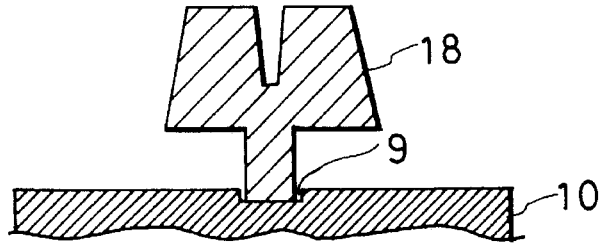

As a result, only the part of the metal film 27 within the first and second windows 28 and 29 is left on the substrate 10, as shown in FIG. 2H, providing the T-shaped gate electrode of the transistor.

The bottom end length $L_G$ of the gate electrode thus obtained is substantially equal to the length $L_{IR}$, i.e., $L_G \approx L_{IR}$.

As described above, with the method of the embodiment, after the first window 13 is formed in the electron resist film 11, the second window 27 larger than the first window 13 is formed in the photoresist film 14. Therefore, the first window 13 can be formed in the electron resist film 11 using the developer solution for the electron resist film 11 even is the mixing layer 15 is present at the interface of the electron resist and photoresist films 11 and 14. This means that the first window 13 can be formed independent of existence of the mixing layer 15, different from the conventional method shown in FIGS. 1A to 1G.

Also, because the second window 17 is formed in the photoresist film 14 after forming the first window 13 in the electron resist film 11, the electron resist film 11 can be developed by using any developer solution that dissolves the electron resist film 11 independent of the photoresist film 14.

Further, the mixing layer 15, which is not soluble in the developer solution for the photoresist film 14, is produced at the interface of the resist films 11 and 14, the length $L_{IR}$ of the resultant first window 13 can be made shorter than the initial length $L_{PMMA}$ thereof without causing pattern defects on the lower part of the T-shaped pattern, i.e., the profile of the first window 13. As a result, the length $L_{IR}$ can be shorter than that corresponding to the performance limit of the electron beam lithography system.

Since the upper mask is the photoresist film 14 that is sensitive to the UV light and the lower mask is the electron resist film 11 that is not sensitive to the UV light, there is an additional advantage that unwanted exposure of the electron resist film 11 does not occur during the exposure process of the photoresist film 14. As a result, the first window 13 is prevented from expanding. In addition, the length of the first window 13, that of the second window 17 and the positional relationship between the windows 13 and 17 can be separately controlled.

In the above embodiment, the electron resist film 11 is used as the lower mask and the electron beam 12 is irradiated to the film 11 for exposure; however, any other resist film and any other source corresponding thereto may be used. For example, the combination of an ion resist film and an ion-beam, that of an X-ray resist film and an X-ray, and that of a photoresist film and far-ultraviolet light may be used.

Additionally, any other film that is not sensitive to UV light may be used as the lower mask. Any other film that is sensitive to UV light and is capable of forming a mixing layer with the lower mask due to the above image-reversal process may be used as the upper mask.

To investigate the effects or advantages of the minimum size reduction of the lower part of the gate electrode, the following test was performed:

A plurality of gate electrodes each of which has the same structure as above were actually produced by the same process sequence as above. The image-reversal process was carried out under the condition that the process gas was $NH_3$, the temperature range was from 20° to 110° C., and the process period was 60 minutes.

The result of the test is shown in Table 1 below, where the values obtained of the initial length $L_{PMMA}$ of the first window 13, the length $L_{IR}$ of the window 13 shortened by the mixing layer 15, and the bottom end length $L_G$ of the gate electrode are shown.

TABLE 1

| $L_{PMMA}$ (nm) | $L_{IR}$ (nm) | $L_G$ (nm) |
| --- | --- | --- |
| 50 | not opened | not formed |
| 108 | 60 | 72 |
| 167 | 120 | 130 |
| 218 | 180 | 200 |
| 287 | 240 | 250 |

It is seen from Table 1 that not only the length $L_{IR}$ of the first window 13 through the image-reversal process and but also the bottom end length $L_G$ of the gate electrode are shorter than the initial length $L_{PMMA}$ of the first window 13.

It is also seen from the Table 1 that the values of $L_G$ are little larger than those of $L_{IR}$, which are not in accordance with the above description in the embodiment. This is due to the following reason:

In the above test, to remove completely the resist films 11 and 14, the substrate 10 with the films 11 and 14 was subjected to an incineration or ashing process before the above metallization step shown in FIG. 2G. During this process, an uncovered part of the mixing layer 15 was slightly reduced in thickness through the incineration or ashing process. The gate electrode was produced by using the mixing layer 15 thus reduced in thickness, so that the values of $L_G$ became little larger than those of $L_{IR}$ that represents the length of the first window 13 prior to the incineration or ashing process.

In the case of no incineration or ashing process, the values of $L_G$ will be substantially equal to those of $L_{IR}$.

To investigate the relationship between $L_{PMMA}$ and $L_{IR}$ and that between $L_{PMMA}$ and $L_G$, the same test was performed again about another lot of the gate electrodes. The results of this test thus obtained are shown in FIGS. 3A and 3B.

Figure 3A:
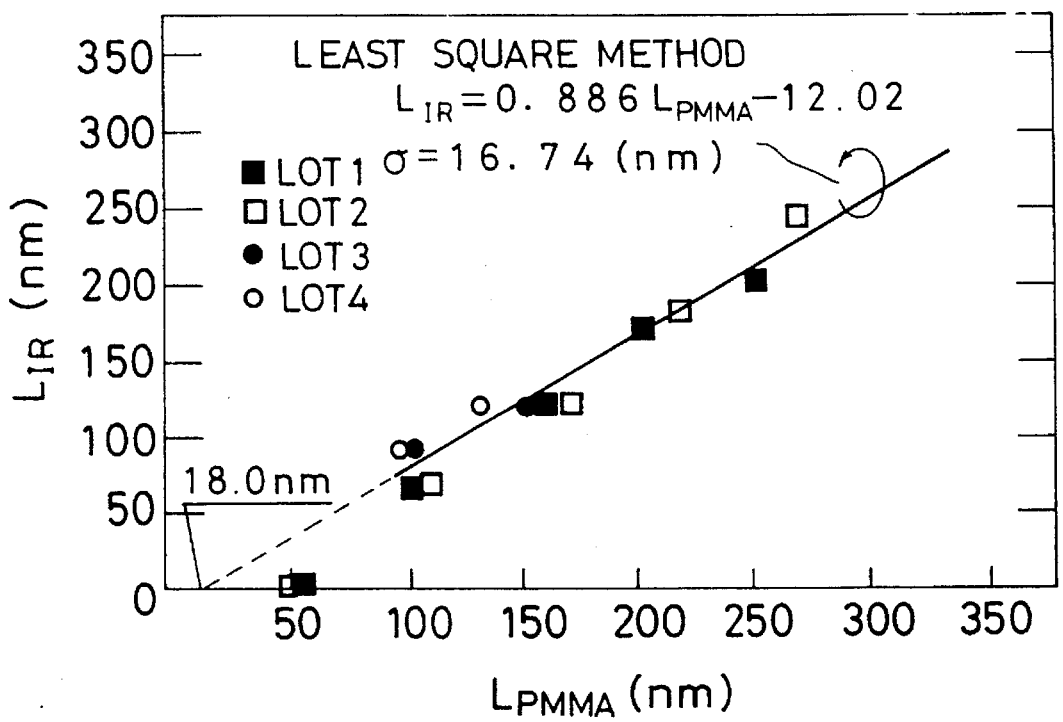
FIG. 3A is a graph showing a relationship between the initial size $L_{PMMA}$ of the first window and the size $L_{IR}$ thereof after an image-reversal process.
Figure 3B:
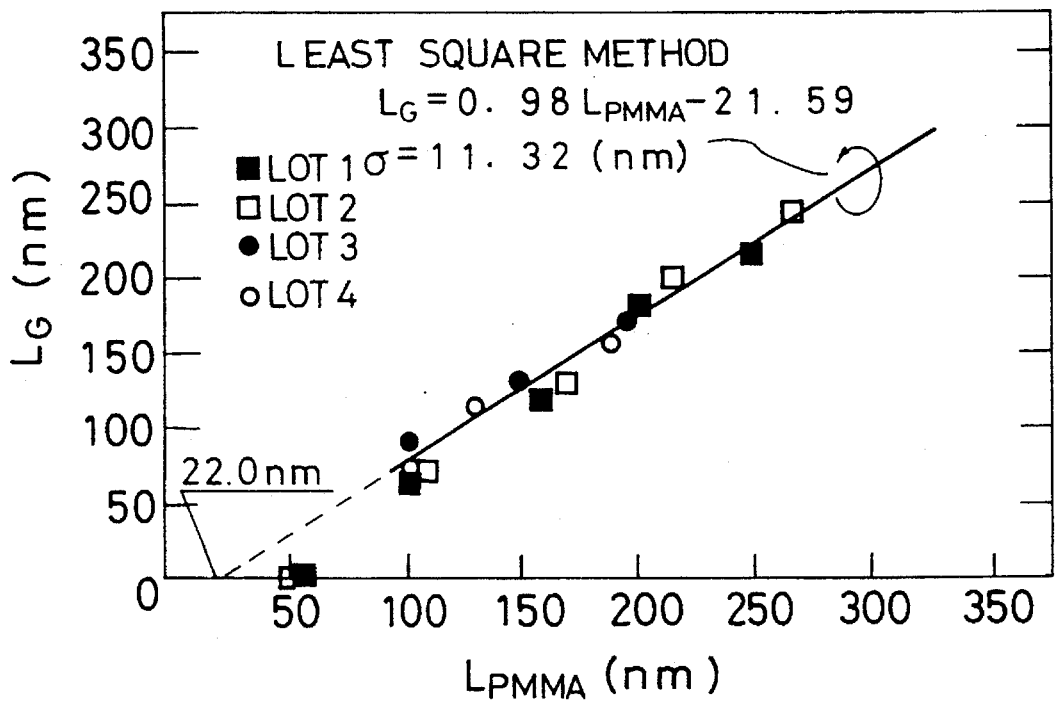
FIG. 3B is a graph showing a relationship between the initial size $L_{PMMA}$ of the first window and the bottom end size $L_g$ of the gate electrode of a field-effect transistor.

FIG. 3A shows the relationship between $L_{PMMA}$ and $L_{IR}$ and FIG. 3B shows the relationship between $L_{PMMA}$ and $L_G$.

The calculation that was performed by the least square method using the test result shown in FIG. 3A provides the following equation (1) as $$L_{IR} = 0.886 L_{PMMA} - 12.02 \tag{1}$$

where $L_{PMMA} \geq 0.1$ μm and the standard deviation σ of $L_{IR}$ is 16.74 nm.

Similarly, the calculation that was performed by the least square method using the test result shown in FIG. 3B provides the following equation (2) as $$L_g = 0.98 L_{PMMA} - 21.59 \tag{2}$$

where $L_{PMMA} \geq 0.1$ μm. the standard deviation σ of $L_G$ is 11.32 nm.

From the equations (1) and (2), it is seen that not only the length $L_{IR}$ after the image-reversal process and but also the length $L_G$ of the gate electrode can be shortened than the initial length $L_{PMMA}$ by about 30 to 50 nm.

For example, if the initial length $L_{PMMA}$ is 0.1 μm, an obtainable bottom and length $L_G$ is about 70 nm or less.

In the embodiment, although the electron resist film 11 is formed on a semiconductor substrate, the film 11 may be formed on or over any other substrate.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A method of forming a semiconductor device having a T-shaped, cross-sectional pattern, said pattern having a first cross-sectional part and a second cross-sectional part larger than said first part; said method comprising the steps of:

forming a first resist film on or over a substrate, said first resist film being insensitive to ultraviolet light;

producing a first window in said first resist film through exposure and developing, said first window corresponding to said first cross-sectional part of said pattern;

forming a second photoresist film on said first resist film to cover said first window, said second resist film being sensitive to ultraviolet light;

exposing said second resist film to said ultraviolet light to create an image in said second resist film; and developing said second resist film to produce a second window according to a reversed image of said image in said second resist film, said second window corresponding to said second cross-sectional part of said pattern, said first and second resist film forming a mixing layer at their interface.

2. The method as claimed in claim 1, further comprising a step of performing an image-reversal process for said second resist film to create said mixing layer at an interface of said first and second resist films.

3. The method as claimed in claim 1, further comprising a step of performing an image-reversal process for said second resist film, said second resist film being subjected to said image-reversal process at a temperature from 20° to 110° C. for 60 minutes or less to create said mixing layer at an interface of said first and second resist films.

4. The method as claimed in claim 3, wherein said image-reversal process is performed in an ammonia gas.

5. The method as claimed in claim 1, wherein said first resist film is not sensitive to the same ultraviolet light that is used for creating an image in said second resist film.

6. The method as claimed in claim 5, wherein said first resist film is selectively irradiated by an electron beam directed to said first resist film for forming said first window.

7. The method as claimed in claim 1, further comprising;

a step of forming a third film for producing a component having a T-shaped cross-section on said second resist film and on said first resist film through said first and second windows; and a step of lifting said first and second resist films off together with part of said third film formed on said second resist film;

wherein remainder of said third film formed on said first resist film is left in place.

8. The method as claimed in claim 2, further comprising;

a step of forming a film for producing a component having a T-shaped cross-section on said second resist film and on said mixing layer through said first and second windows; and a step of lifting said first and second resist films off together with part of said film formed on said second resist film;

wherein remainder of said film formed on said mixing layer is left.

9. A method of forming a T-shaped, cross-sectional pattern, said pattern having a first cross-sectional part and a second cross-sectional part larger than said first part; said method comprising the steps of:

forming a first resist film on or over a semiconductor substrate;

producing a first window in said first resist film through exposure and developing, said first window corresponding to said first cross-sectional part of said pattern;

forming a second resist film on said first resist film to cover said first window, said second resist film being sensitive to ultraviolet light;

selectively exposing said second resist film to said ultraviolet light to create an image in said second resist film;

performing an image-reversal process to said second resist film, wherein a mixing layer being created at an interface of said first and second resist films through said image-reversal process; and developing said second resist film to produce a second window according to a reversed image of said image in said second resist film, said second window corresponding to said second cross-sectional part of said pattern.

10. The method as claimed in claim 9, wherein said step of performing an image-reversal process comprises a first step of keeping said second resist film in an ammonia gas at a temperature from 20° to 110° C. for 60 minutes or less, and a second step of exposing said second resist film to said ultraviolet light to make a part of said second resist film corresponding to said second window soluble in a developer solution for said second resist film.

11. The method as claimed in claim 9, wherein said first resist film is not sensitive to the ultraviolet light that is exposed to said second resist film.

12. The method as claimed in claim 11, wherein said first resist film is an electron resist film and applying an electron beam to selectively irradiate said first resist film for producing said first window.

13. The method as claimed in claim 9, further comprising;

a step of forming a third film for producing a component having a T-shaped cross-section on said second resist film and on said first resist film through said first and second windows; and a step of lifting said first and second resist films off together with part of said third film formed on said second resist film;

wherein a remainder of said third film formed on said first resist film is left in place.

14. The method as claimed in claim 10, further comprising;

a step of forming a third film for producing a component having a T-shaped cross-section on said second resist film and on said mixing layer through said first and second windows; and a step of lifting said first and second resist films off together with part of said third film formed on said second resist film;

wherein remainder of said third film formed on said mixing layer is left in place.

* * * * *